United States Patent
Shepard et al.

(10) Patent No.: US 10,674,641 B2
(45) Date of Patent: Jun. 2, 2020

(54) IMMERSION COOLING SYSTEMS AND METHODS

(71) Applicant: Hamilton Sundstrand Corporation, Charlotte, NC (US)

(72) Inventors: Charles Shepard, DeKalb, IL (US); Kris H. Campbell, Poplar Grove, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 243 days.

(21) Appl. No.: 15/090,049

(22) Filed: Apr. 4, 2016

(65) Prior Publication Data
US 2017/0290205 A1 Oct. 5, 2017

(51) Int. Cl.
*H05K 7/20* (2006.01)

(52) U.S. Cl.
CPC ......... *H05K 7/20936* (2013.01); *H05K 7/203* (2013.01)

(58) Field of Classification Search
CPC ............ H05K 7/20854; H05K 7/1492; H05K 7/20763; H05K 7/20718; H05K 7/20236; H05K 7/20936; H05K 7/203
See application file for complete search history.

(56) References Cited

U.S. PATENT DOCUMENTS

| | | | | |
|---|---|---|---|---|
| 3,406,244 A | * | 10/1968 | Oktay | F28C 3/04 165/104.13 |
| 3,851,221 A | * | 11/1974 | Beaulieu | H01L 23/44 257/714 |
| 5,315,154 A | * | 5/1994 | Elwell | H01L 23/3737 257/707 |
| 5,455,458 A | * | 10/1995 | Quon | F28D 20/02 257/712 |
| 5,831,831 A | * | 11/1998 | Freeland | H01L 23/4275 257/707 |
| 6,104,611 A | * | 8/2000 | Glover | F28D 15/06 165/104.33 |
| 6,317,321 B1 | * | 11/2001 | Fitch | F28D 20/02 165/104.33 |
| 6,392,883 B1 | * | 5/2002 | Ali | G06F 1/203 165/185 |

(Continued)

FOREIGN PATENT DOCUMENTS

GB 578869 A 7/1946

OTHER PUBLICATIONS

The extended European search report received from the European Patent Office dated Sep. 5, 2017, for Application No. EP17164790.2.

(Continued)

*Primary Examiner* — Daniel P Wicklund
*Assistant Examiner* — Christopher L Augustin
(74) *Attorney, Agent, or Firm* — Locke Lord LLP; Scott D. Wofsy; Joshua L. Jones

(57) ABSTRACT

An electronics cooling arrangement includes a housing, an electronic device disposed within the housing, and a solid-liquid phase change material disposed within the housing and is in thermal communication with the electronic device to absorb heat generated by the electronic device. A method of cooling an electronic device and a vehicular electronics cooling system are also described.

10 Claims, 3 Drawing Sheets

(56) References Cited

U.S. PATENT DOCUMENTS

| | | | | |
|---|---|---|---|---|
| 6,628,521 | B2* | 9/2003 | Gustine | H05K 7/20409 165/80.3 |
| 7,002,800 | B2* | 2/2006 | Elias | H01L 23/3733 165/104.33 |
| 7,240,494 | B2* | 7/2007 | Akei | F25B 1/00 62/238.7 |
| 8,345,423 | B2* | 1/2013 | Campbell | F28D 15/0233 165/104.33 |
| 8,369,091 | B2* | 2/2013 | Campbell | F28F 3/04 165/104.33 |
| 8,636,052 | B2 | 1/2014 | Kline et al. | |
| 8,953,317 | B2* | 2/2015 | Campbell | H05K 7/203 165/104.33 |
| 2002/0033247 | A1* | 3/2002 | Neuschutz | F28D 20/02 165/10 |
| 2003/0062149 | A1* | 4/2003 | Goodson | F04B 19/006 165/104.11 |
| 2007/0009084 | A1* | 1/2007 | Bhatt | G01N 23/046 378/57 |
| 2009/0033410 | A1* | 2/2009 | Nelson | H03K 17/567 327/581 |
| 2010/0246093 | A1* | 9/2010 | Falabella | H01B 3/002 361/314 |
| 2011/0049976 | A1* | 3/2011 | Suzuki | H05K 7/20936 307/9.1 |
| 2011/0315344 | A1* | 12/2011 | Campbell | F28F 3/04 165/80.4 |
| 2012/0307500 | A1* | 12/2012 | Hitchcock | F21V 25/10 362/285 |
| 2013/0105120 | A1* | 5/2013 | Campbell | H05K 7/203 165/104.21 |
| 2013/0205822 | A1* | 8/2013 | Heiland | H05K 7/2079 62/259.2 |
| 2013/0271913 | A1 | 10/2013 | MacDonald | |
| 2014/0029203 | A1* | 1/2014 | Joshi | H05K 7/20345 361/714 |
| 2014/0043754 | A1 | 2/2014 | Hartmann et al. | |
| 2015/0070846 | A1* | 3/2015 | Shelnutt | H05K 7/203 361/700 |
| 2015/0109735 | A1* | 4/2015 | Campbell | H05K 7/20318 361/700 |
| 2016/0073548 | A1* | 3/2016 | Wei | H05K 7/203 361/700 |

OTHER PUBLICATIONS

"A Survey of Vapor Phase Cooling Systems", Electrical Design News,, vol. 14, No. 1, Jan. 1, 1969 (Jan. 1, 1969), pp. 53-56, XP001450302, * figure 3 * Simons R.E., et al.

* cited by examiner

IMMERSION COOLING SYSTEMS AND METHODS

BACKGROUND OF THE INVENTION

1. Field of the Invention

The present disclosure relates to electrical systems, and more particularly to cooling arrangements for electronic devices in electrical systems.

2. Description of Related Art

Electrical power systems commonly include devices like solid-state power converters, motor controllers, and battery charging modules. Such devices generate heat during operation from electrical power applied to the devices, which typically is removed using a cooling arrangement. The cooling arrangement is generally selected according to the amount of heat that the device generates during operation, examples of cooling arrangements including conduction cooling, natural convection cooling, radiation cooling, forced-air cooling, and liquid cooling.

With the advent of the 'more electric' vehicles, power systems increasingly employ electronic devices with increased power densities. The increased power densities of such electronic devices can be accompanied with increased heat generation, which has led to research into the use of immersion cooling for certain types of electronic devices. Immersion cooling arrangements can remove relatively large amounts of heat from electronic devices, typically by positioning a coolant with relatively high thermal capacity in direct contact with heat generating components, thereby allowing the coolant to absorb heat generated by the heat-generating components. The coolants employed in such cooling arrangements can be heavy in comparison to other cooling arrangements.

Such conventional methods and systems have generally been considered satisfactory for their intended purpose. However, there is still a need in the art for improved immersion cooling systems. The present disclosure provides a solution for this need.

SUMMARY OF THE INVENTION

An electronics cooling arrangement includes a housing, an electronic device disposed within the housing, and a solid-liquid phase change material (PCM) is disposed within the housing and is in thermal communication with the electronic device to absorb heat generated by the electronic device.

In certain embodiments, the electronic cooling arrangement can include an immersion cooling assembly. The housing can be a sealed housing. The housing can have a fixed volume. A liquid-vapor phase dielectric coolant can be contained within the housing. The electronic device can be submerged within the liquid-vapor phase coolant. The solid-liquid PCM can include wax or paraffin. The solid-liquid PCM can be fully submerged within the liquid-vapor phase coolant. The solid-liquid PCM can be partially submerged within the liquid-vapor phase coolant. The solid-liquid PCM can directly contact the liquid-vapor phase coolant. The solid-liquid PCM can indirectly contact with the liquid-vapor phase coolant.

In accordance with certain embodiments, the solid-liquid PCM can be a free-floating PCM body buoyantly suspended within the liquid-vapor phase coolant. A portion of the PCM body can be disposed below a surface of the liquid-vapor coolant. A portion of the PCM body can be disposed above the surface of the liquid-vapor coolant. The solid-liquid PCM can be contained within an envelope. The PCM envelope can be sealed. The PCM envelope can be submerged within the liquid-vapor phase coolant. The PCM envelope can be fixed relative to the sealed housing. The PCM envelope can be free-floating within the liquid-vapor phase coolant. It is contemplated that the PCM envelope can be a first PCM envelope enclosing a first portion of solid-liquid PCM, and a second PCM envelope can be disposed within the sealed housing and contain a second portion of solid-liquid PCM.

It is also contemplated that, in accordance with certain embodiments, the sealed housing and the dielectric coolant define therebetween an ullage space. A condenser can be disposed within the ullage space. A portion of the solid-liquid PCM can be disposed within the ullage space. A heat exchanger can be disposed on a side of the ullage space opposite the liquid-vapor dielectric coolant. The electronic device can include a conductor in direct contact with the dielectric coolant. The electronic device can include a capacitor, an inductor, a printed circuit board, and/or a solid-state switch device. The electronic device can be a solid-state power converter, such as in a motor controller for a vehicular electrical system.

A motor controller for a vehicular electrical system includes a sealed housing, a liquid-vapor phase dielectric coolant contained within the sealed housing, an electronic device submerged within the dielectric coolant with the electronic device having a conductor in direct contact with the dielectric coolant, and a solid-liquid PCM contained within the sealed housing. The solid-liquid PCM is free-floating within the dielectric coolant, and is in thermal communication with the conductor through the liquid-vapor phase dielectric coolant.

A method of cooling an electronic device includes transferring heat from the electronic device to a fluid. The method also includes transferring heat from the fluid to a solid-liquid PCM.

In certain embodiments, the method can include heating a liquid-vapor phase dielectric coolant contained within a sealed housing using an electronic device submerged within the coolant. The method can include transferring heat from the liquid-vapor phase coolant into a solid-liquid PCM disposed within the dielectric coolant. The method can include maintaining the dielectric coolant at a substantially constant temperature while transferring heat from the dielectric coolant and into the solid-liquid PCM. The method can include melting or solidifying the solid-liquid PCM using dielectric coolant while the dielectric coolant maintains a uniform temperature.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
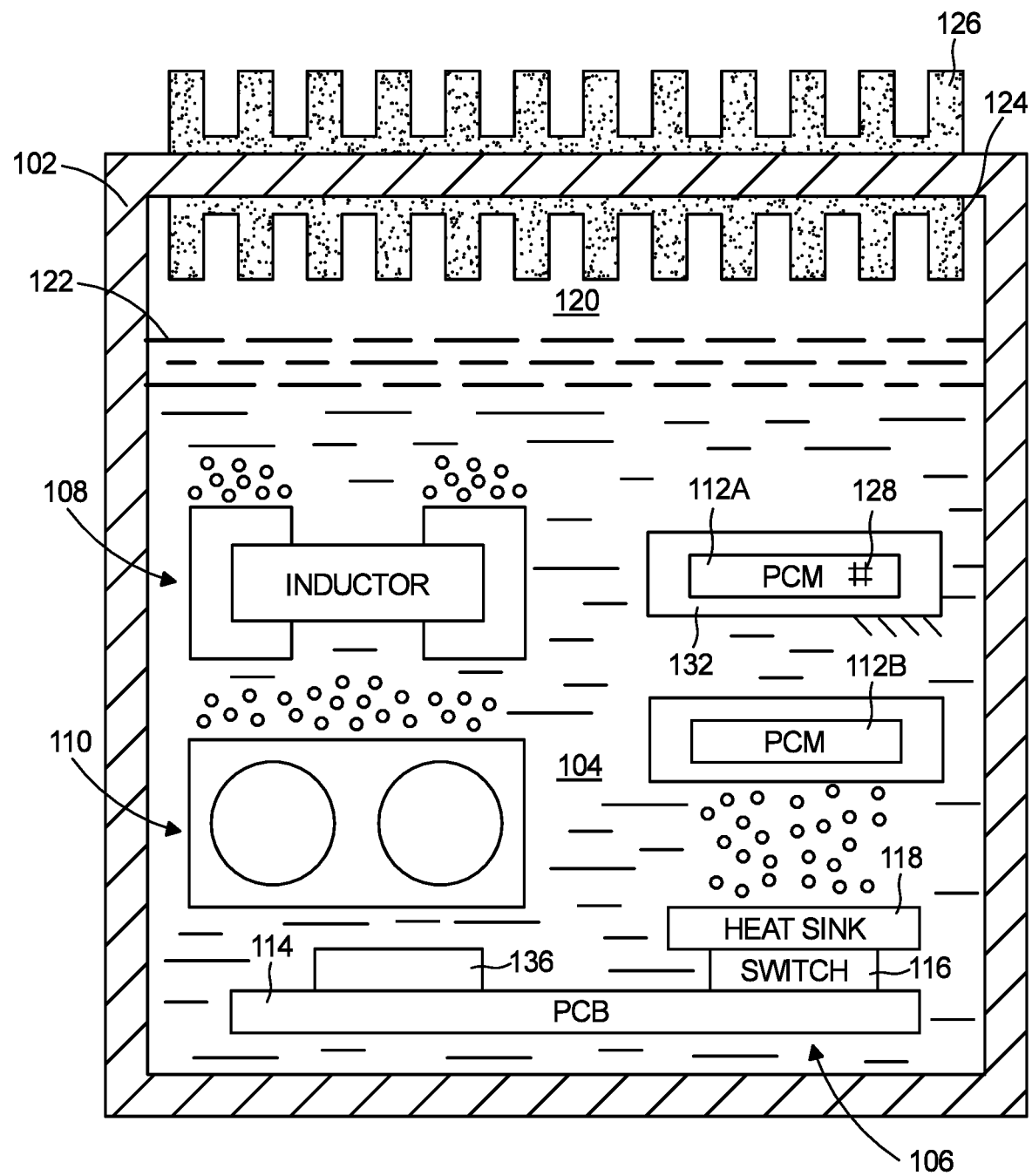
FIG. 1 is a schematic view of an exemplary embodiment of an electronics cooling arrangement constructed in accordance with the present disclosure, showing an immersion cooled electronic assembly with solid-liquid phase change material (PCM) body confined within an envelope, the enveloped PCM body being disposed with a coolant contained within a housing.

Reference will now be made to the drawings wherein like reference numerals identify similar structural features or aspects of the subject disclosure. For purposes of explanation and illustration, and not limitation, a partial view of an exemplary embodiment of an electronics cooling arrangement in accordance with the disclosure is shown in FIG. 1 and is designated generally by reference character 100. Other embodiments of electronics cooling arrangements, immersion cooled electronic assemblies, and methods of removing heat from such arrangements and assemblies in accordance with the disclosure, or aspects thereof, are provided in FIGS. 2 and 3, as will be described. The systems and methods described herein can be used in vehicle electrical systems, such as in motor controllers and/or power converters, though the present disclosure is not limited power converters, motor controllers, or to vehicular electrical systems in general.

Referring to FIG. 1, electronics cooling arrangement 100 is shown. Electronics cooling arrangement 100 includes a housing 102, an electronic device, e.g., a printed circuit board (PCB) assembly 106, an inductor 108, and/or a capacitor 110, each disposed within housing 102. A solid-liquid phase change material (PCM) 128 is also disposed within housing 102. Solid-liquid PCM 128 and is in thermal communication with the electronic device to absorb heat generated by the electronic device.

Housing 102 is sealed with respect to the external environment, has a fixed volume, and contains within its interior a coolant 104. Coolant 104 is electrically insulative, thermally conductive material, and may include a dielectric coolant. Examples of suitable dielectric coolants include coolants containing perfluorohexane (FC-72), perfluoro (FC-75), and/or perfluorotripentylamine (FC-70). FC-72, FC-75, and FC-70 are available under the tradename Flourinert® from the 3M Company of Maplewood, Minn.

A portion of coolant 104 is disposed within a lower (relative to the direction of gravity) portion of the interior of housing 102 in a liquid phase. A portion of coolant 104 in a vapor phase is disposed within an ullage space 120 disposed in an upper portion of the interior of housing 102, a liquid surface 122 of coolant 104 separating vapor phase coolant resident in ullage space 120 from liquid phase coolant. As will be appreciated by those of skill in the art in view of the present disclosure, coolant 104 has vapor phase to liquid phase ratio according to an amount of liquid state coolant evaporated into vapor state coolant from heat transferred into coolant 104 from operation of the electronic device(s) submerged within coolant 104.

A condenser 124 is disposed within ullage space 120. Condenser 124 is in thermal communication with a heat exchanger 126 through a wall of housing 102, heat exchanger 126 being disposed on an exterior of housing 102. Condenser 124 and heat exchanger 126 each have a plurality of fins for purposes of providing increased surface area for heat transfer, and as illustrated include discrete finned bodies connected to housing 102. As will be appreciated by those of skill in the art, either or both of condenser 124 and heat exchanger 126 may be defined by housing 102, such as by fins defined by one or more interior and/or exterior surfaces of the walls of housing 102.

PCB assembly 106 includes a printed circuit board (PCB) 114, solid-state switch device 116, and heat sink 118 each disposed within housing 102 and submerged within coolant 104. Solid-state switch device 116 is connected to a surface of PCB assembly 106, and may include a field effect transistor device like a MOSFET or an insulated gate bipolar transistor (IGBT) device for a power converter. Heat sink 118 is connected to solid-state switch device 116, serves to increase the rate heat transfer from solid-state switch device 116 to coolant 104, and allows for relatively compact spacing of electrical components on the surface of PCB 114. One or more conductive elements of the electronic device, e.g., a conductor of PCB assembly 106, are in direct contact with coolant 104.

Solid-liquid PCM 128 is disposed within housing 102 as a PCM body, e.g., a first PCM body 112A and a second PCM body 112B, submerged within coolant 104, the PCM body being in thermal communication with the one or more electronic devices through coolant 104. It is contemplated that the thermal communication between coolant 104 and the PCM body be such that coolant 104 maintains substantially constant temperature while the one or more electronic devices intermittently generate heat, for example according to a duty cycle a solid-state switch 116 incorporated in PCB assembly 106 and submerged within coolant 104. In the illustrated exemplary embodiment, electronic cooling arrangement 100 is an immersion cooled electronic assembly.

Solid-liquid PCM 128 has a melting temperature that is within a predetermined temperature range and may include wax or paraffin by way of non-limiting example. The PCM body including solid-liquid PCM 128 can be fixed within housing 102, as indicated in an exemplary manner with fixed first PCM body 112A. The PCM body including solid-liquid PCM 128 can be free-floating within housing 102, as indicated in an exemplary manner with free-floating second PCM body 112B. It is contemplated that the PCM body can be fully submerged within coolant 104. Solid-liquid PCM 128 is contained within an envelope 132, which encapsulates solid-liquid PCM 128 of first PCM body 112A. Envelope 132 provides thermal communication between solid-liquid PCM 128 and coolant 104, and mechanically separates solid-liquid PCM 128 from coolant 104. Envelope 132 may include an electrically insulative material, which prevents electrically interaction with exposed conductors, e.g., exposed electrical conductor 136, which is in direct contact with coolant 104.

Figure 2:
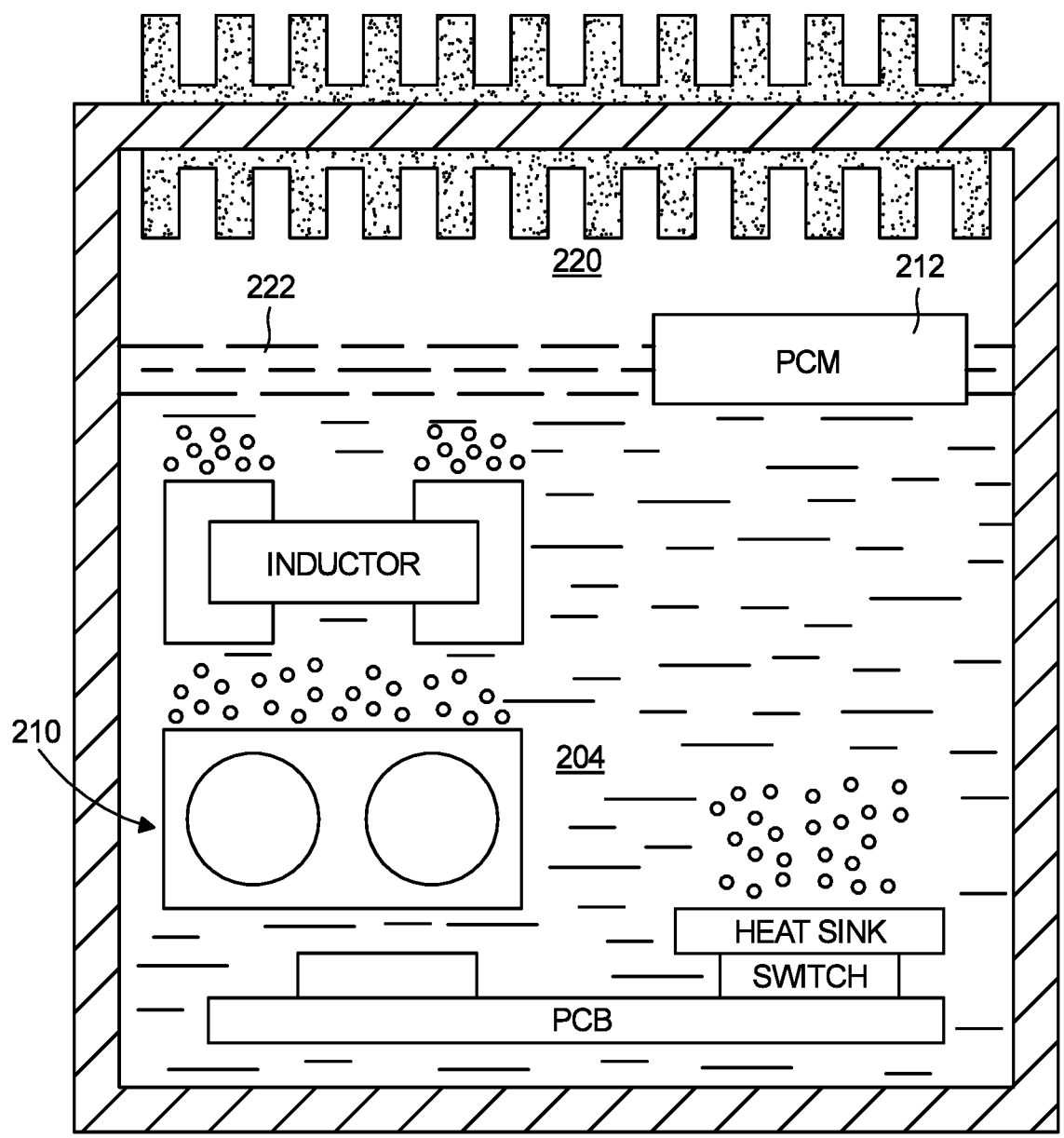
FIG. 2 is a schematic view of another embodiment of an electronics cooling arrangement constructed in accordance with the present disclosure, showing an unconfined PCM body disposed within a liquid-vapor dielectric coolant, both the PCM and coolant being contained within a housing.

With reference to FIG. 2, an electronic cooling arrangement 200 is shown. Electronic cooling arrangement 200 is similar to electronic cooling arrangement 100 (shown in FIG. 1), and additionally includes a PCM body 212 in direct mechanical contact with coolant 204. Direct mechanical contact between PCM body 212 and coolant 204 can improve the responsiveness of heat rejection (or buffering) to PCM body 212, there being no intermediate interfaces across which heat moving between coolant 204 and PCM body 212 would otherwise have to traverse. It is contemplated that PCM body 212 can be buoyant, and in the illustrated exemplary embodiment floats on liquid surface 224 of coolant 204. It is also contemplated that the PCM body 212 be partially submerged within coolant 204, a portion of the PCM body 212 residing within ullage space 220.

Figure 3:
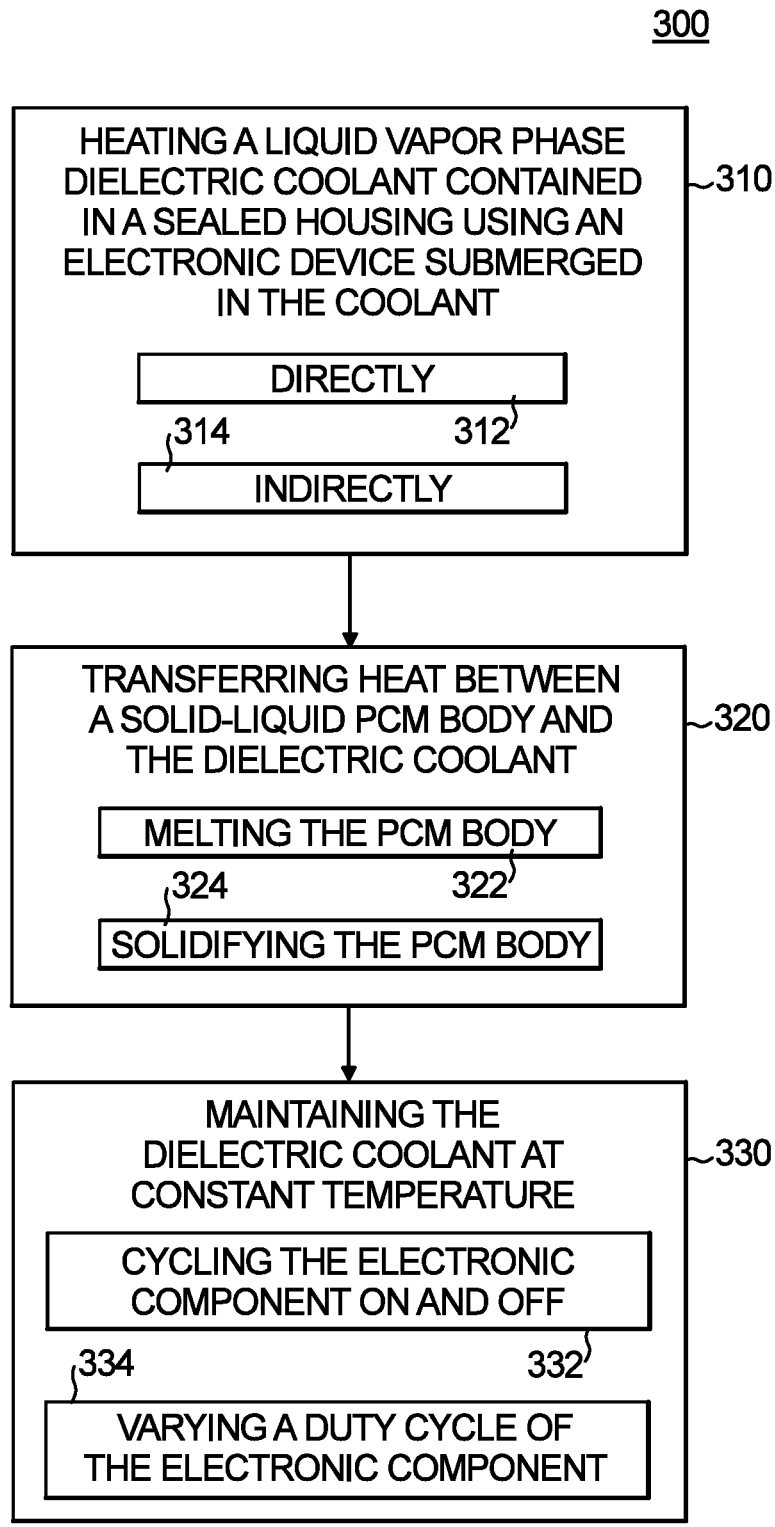
FIG. 3 is a diagram of a method of cooling an electronic device, showing steps of the method.

With reference to FIG. 3, a method 300 of cooling an electronic device, e.g., PCB assembly 106 (shown in FIG. 1) is shown. Method 300 generally includes transferring heat from the electronic device to a fluid, e.g. coolant 104 (shown in FIG. 1), and transferring heat from the fluid to a solid-liquid PCM, e.g. first PCM body 112A (shown in FIG. 1).

In embodiments, method 300 may include heating a liquid-vapor phase coolant, e.g., coolant 104 or 204, contained within a housing, e.g., housing 102 (shown in FIG. 1) or housing 202 (shown in FIG. 2), using an electronic device, e.g., exposed electrical conductor 136 (shown in FIG. 1) or exposed conductor 236 (shown in FIG. 2), submerged within the coolant, as shown with box 310. Heating can be through direct contact of the electronic device with the coolant, as shown with box 312. Heating can be through indirect contact of the electronic device with the coolant, as shown with box 314.

Method 300 also includes transferring heat between the liquid-vapor phase coolant into a solid-liquid phase change material, e.g., first PCM body 112A (shown in FIG. 1) or PCM body 212 (shown in FIG. 2), disposed within the coolant, as shown with box 320. Transferring heat can include melting the PCM body, as shown with box 322. Transferring heat can include solidifying the PCM body, as shown with box 324.

The coolant can be maintained at a substantially constant temperature while heat flows between the coolant and into the solid-liquid PCM, as shown with box 330. The constant temperature can be maintained while one or more electrical devices are cycled on and off, as shown with box 332. The constant temperature can be maintained while one or more solid-state switch devices, e.g., solid-state switch device 116 (shown in FIG. 1) or solid-state switch device 216 (shown in FIG. 2), operate according to a variable duty cycle, as shown with box 334.

The methods and systems of the present disclosure, as described above and shown in the drawings, provide for immersion cooled electronic devices with superior properties including improved pressure control. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An electronics cooling arrangement, comprising:
   a sealed housing;
   a liquid-vapor phase dielectric coolant contained within the sealed housing;
   an electronic device including a printed circuit board (PCB) disposed within the sealed housing and submerged with the liquid-vapor phase coolant, wherein the PCB has an exposed conductor submerged within the liquid vapor-phase dielectric coolant and in direct mechanical contact with the liquid-vapor phase dielectric coolant; and
   a solid-liquid phase change material (PCM) disposed within the sealed housing at least partially submerged within the liquid-vapor phase dielectric coolant and in thermal communication with the electronic device, wherein the solid-liquid PCM is configured to absorb heat generated by the electronic device, wherein solid-liquid PCM is in direct contact with the liquid-vapor phase dielectric coolant disposed within the housing.

2. The electronics cooling arrangement as recited in claim 1, wherein the solid-liquid PCM is fully submerged within the liquid-vapor phase coolant disposed within the housing.

3. The electronics cooling arrangement as recited in claim 1, wherein the solid-liquid PCM is partially submerged within the liquid-vapor phase coolant disposed within the housing.

4. The electronics cooling arrangement as recited in claim 1, wherein the solid-liquid PCM includes wax body.

5. The electronics cooling arrangement as recited in claim 1, wherein the housing and a liquid-vapor phase coolant disposed within the housing define therebetween an ullage space, a condenser being disposed within the ullage space, and a portion of the solid-liquid PCM being disposed within the ullage space.

6. The electronics cooling arrangement as recited in claim 5, further including a heat exchanger disposed on a side of the ullage space opposite the condenser.

7. The electronics cooling arrangement as recited in claim 1, wherein the electronic device comprises at least one of a capacitor, a heat sink, and a solid-state power converter.

8. The electronics cooling arrangement as recited in claim 1, wherein the housing has a fixed volume.

9. The electronics cooling arrangement as recited in claim 1, wherein the PCM is free-floating within the liquid-vapor phase coolant disposed within the housing.

10. The electronics cooling arrangement as recited in claim 1, wherein the housing and a liquid-vapor phase coolant disposed within the housing define therebetween an ullage space, a condenser being disposed within the ullage space, and a portion of the solid-liquid PCM being disposed within the ullage space.

* * * * *